(12) United States Patent
Song et al.

(10) Patent No.: US 12,090,600 B2
(45) Date of Patent: Sep. 17, 2024

(54) FACE-UP WAFER ELECTROCHEMICAL PLANARIZATION APPARATUS

(71) Applicant: Applied Materials, Inc., Santa Clara, CA (US)

(72) Inventors: Kevin H. Song, San Jose, CA (US); Benedict W. Pang, Burlingame, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/833,422

(22) Filed: Jun. 6, 2022

(65) Prior Publication Data
US 2023/0390887 A1   Dec. 7, 2023

(51) Int. Cl.
*B24B 37/04*   (2012.01)
*B24B 57/02*   (2006.01)
*H01L 21/3105*   (2006.01)
*H01L 21/321*   (2006.01)

(52) U.S. Cl.
CPC .......... *B24B 37/046* (2013.01); *B24B 37/044* (2013.01); *B24B 57/02* (2013.01); *H01L 21/31053* (2013.01); *H01L 21/32125* (2013.01)

(58) Field of Classification Search
None
See application file for complete search history.

(56) References Cited

U.S. PATENT DOCUMENTS

| | | | |
|---|---|---|---|
| 6,991,526 B2* | 1/2006 | Sun | B24B 37/042 451/36 |
| 2002/0111121 A1 | 8/2002 | Sun et al. | |
| 2003/0114087 A1 | 6/2003 | Duboust et al. | |
| 2004/0182721 A1* | 9/2004 | Manens | B24B 37/046 205/645 |
| 2004/0214510 A1* | 10/2004 | So | B24B 37/046 451/41 |

(Continued)

FOREIGN PATENT DOCUMENTS

| | | |
|---|---|---|
| JP | 10180620 A | 7/1998 |
| JP | 2001252861 A | 9/2001 |

(Continued)

OTHER PUBLICATIONS

Application No. PCT/US2022/044958, International Search Report and the Written Opinion, Mailed On Feb. 24, 2023, 10 pages.

*Primary Examiner* — Sylvia MacArthur
(74) *Attorney, Agent, or Firm* — Kilpatrick Townsend & Stockton LLP

(57) ABSTRACT

Exemplary substrate electrochemical planarization apparatuses may include a chuck body defining a substrate support surface. The apparatuses may include a retaining wall extending from the chuck body. The apparatuses may include an electrolyte delivery port disposed radially inward of the retaining wall. The apparatuses may include a spindle that is positionable over the chuck body. The apparatuses may include an end effector coupled with a lower end of the spindle. The end effector may be conductive. The apparatuses may include an electric contact extending from the chuck body or retaining wall. The apparatuses may include a current source. The current source may be configured to provide an electric current to an electrolyte within an open interior defined by the retaining wall.

14 Claims, 4 Drawing Sheets

(56) References Cited

U.S. PATENT DOCUMENTS

| | | |
|---|---|---|
| 2005/0115838 A1 | 6/2005 | Mori et al. |
| 2006/0223425 A1 | 10/2006 | Doan et al. |
| 2007/0295610 A1* | 12/2007 | Chen .................. B24B 57/02 |
| | | 205/663 |
| 2019/0299354 A1 | 10/2019 | Ando et al. |

FOREIGN PATENT DOCUMENTS

| | | |
|---|---|---|
| JP | 2001345298 A | 12/2001 |
| JP | 3336191 B2 | 10/2002 |
| KR | 101042321 B1 | 6/2011 |
| TW | 202135221 A | 9/2021 |

* cited by examiner

FACE-UP WAFER ELECTROCHEMICAL PLANARIZATION APPARATUS

TECHNICAL FIELD

The present technology relates to semiconductor systems, processes, and equipment. More specifically, the present technology relates to planarizing film deposited on a substrate.

BACKGROUND

An integrated circuit is typically formed on a substrate by the sequential deposition of conductive, semiconductive, and/or insulative layers on a silicon wafer. A variety of fabrication processes use the planarization of a layer on the substrate between processing steps. For example, for certain applications, e.g., planarization of a metal layer to form vias, plugs, and/or lines in the trenches of a patterned layer, an overlying layer is planarized until the top surface of a patterned layer is exposed. In other applications, e.g., planarization of a dielectric layer for photolithography, an overlying layer is polished until a desired thickness remains over the underlying layer.

Chemical mechanical polishing (CMP) is one common method of planarization. This planarization method typically requires that the substrate be mounted on a carrier or polishing head. The exposed surface of the substrate is typically placed against a rotating polishing pad. The carrier head provides a controllable load on the substrate to push it against the polishing pad. Abrasive polishing slurry is typically supplied to the surface of the polishing pad.

One problem in CMP is uniformly polishing the entire surface of the substrate. Oftentimes, the mechanical force applied during CMP operations may remove exposed portions of a first material at faster rates than exposed portions of a second material, which may lead to uneven polishing. As a result, film thickness across the substrate is not uniform, and some materials, such as metal materials, may be removed faster than, for example, dielectric materials, resulting in dishing of the metal materials. This film non-uniformity may cause lithography issues and may lead to a loss in die yield from a given substrate.

Thus, there is a need for improved systems and methods that can be used to polish or planarize substrates to generate a uniform film across an entire surface area of the substrate. These and other needs are addressed by the present technology.

SUMMARY

Exemplary substrate electrochemical planarization apparatuses may include a chuck body defining a substrate support surface. The apparatuses may include a retaining wall extending from the chuck body. The apparatuses may include an electrolyte delivery port disposed radially inward of the retaining wall. The apparatuses may include a spindle that is positionable over the chuck body. The apparatuses may include an end effector coupled with a lower end of the spindle. The end effector may be conductive. The apparatuses may include an electric contact extending from the chuck body or retaining wall. The apparatuses may include a current source. The current source may be configured to provide an electric current to an electrolyte within an open interior defined by the retaining wall.

In some embodiments, the end effector may be characterized by a diameter of less than or about 150 mm. The spindle may be rotatable and laterally translatable relative to the chuck body. A surface of the end effector facing the substrate support surface may be planar. The retaining wall may be annular. A diameter of end effector may be less than an inner diameter of the retaining wall. The apparatuses may include an electrolyte drainage port positioned within one or both of the chuck body and the retaining wall. The apparatuses may include an edge ring seated on the chuck body.

Some embodiments of the present disclosure encompass substrate electrochemical planarization apparatuses. The apparatuses may include a chuck body defining a substrate support surface. The apparatuses may include a spindle that is positionable over the chuck body. The apparatuses may include a rotation drive mechanism coupled with the spindle. The apparatuses may include an end effector coupled with a lower end of the spindle. The apparatuses may include an electric contact extending from the chuck body. The apparatuses may include a current source. The current source may be configured to provide an electric current to an electrolyte within an open interior defined by a retaining wall extending from the chuck body.

In some embodiments, the end effector comprises a conductive material. The apparatuses may include an edge ring seated on the chuck body. An inner diameter of the edge ring may be less than about 5% larger than a diameter of substrate support surface. The apparatuses may include a retaining wall disposed radially outward of the chuck body. The retaining wall may be annular. A diameter of end effector may be less than an inner diameter of the retaining wall. The apparatuses may include an electrolyte source. The apparatuses may include an electrolyte delivery port fluidly coupled with the electrolyte source. The electrolyte delivery port may be disposed radially inward of the retaining wall. The substrate electrochemical planarization apparatus may be disposed within a polishing chamber that comprises a face down polishing station.

Some embodiments of the present disclosure encompass methods of planarizing a substrate. The methods may include positioning a substrate face up atop a substrate support surface of a chuck body within an open interior defined by a retaining wall extending from the chuck body. The methods may include clamping the substrate to the chuck body. The methods may include delivering an electrolyte to a top surface of the substrate. The methods may include engaging the top surface of the substrate with an end effector coupled with a lower end of a spindle. The methods may include applying an electric current to the electrolyte.

In some embodiments, the methods may include laterally translating the spindle while rotating the end effector against the top surface of the substrate. The methods may include moving the end effector relative to the substrate. Less than or about 2.0 psi of downward force may be applied to the end effector while rotating the end effector against the top surface of the substrate. A central axis of the end effector may be offset from a central axis of the substrate while rotating the end effector against the top surface of the substrate. The methods may include draining the electrolyte from the open interior via an electrolyte drainage port positioned within one or both of the chuck body and the retaining wall.

Such technology may provide numerous benefits over conventional systems and techniques. For example, the electrochemical planarization apparatuses described herein may enable a planarization of a substrate during planarizing operations without removing some portions of exposed material at a faster rate than other portions of exposed material. Oftentimes, the planarization techniques described herein may be used before and/or after a conventional CMP operation. This may enable the film thickness and metal feature uniformity to be improved across the surface of the substrate, which may lead to increased die yield. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
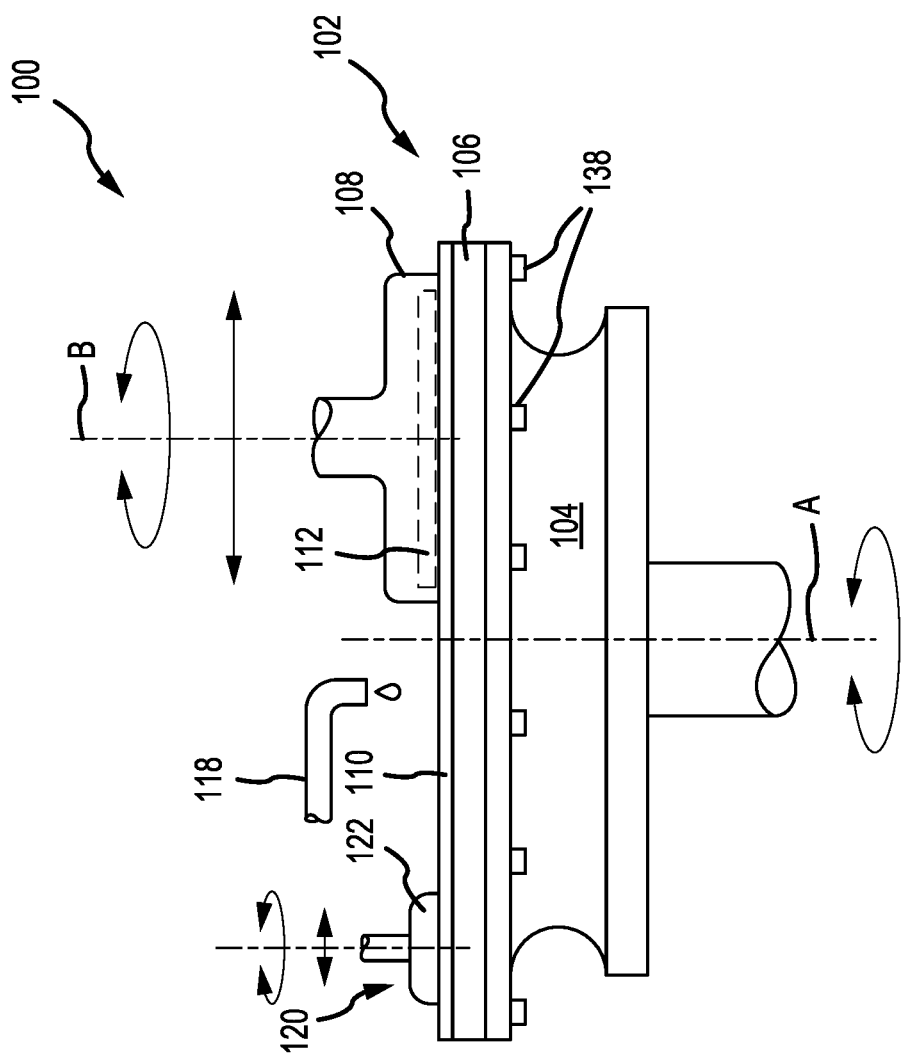
FIG. 1 shows a schematic cross-sectional view of an exemplary chemical-mechanical planarization system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In conventional chemical mechanical polishing (CMP) operations it is often difficult to uniformly polish the surface of a substrate. Conventional CMP polishing involves a substrate being positioned face down on a polishing pad, with a carrier that holds the substrate against a rotating polishing pad. However, the pressure between the polishing pad and the substrate often imparts mechanical force that results in non-uniform film thickness post-polishing operation. For example, the mechanical force may cause dishing of metal material within trenches that are exposed on a surface of the substrate. These issues may result in non-uniformity issues that result in a lower die yield. Additionally, wearing of the metal material within the trenches may result in electrical connections on the final integrated circuit or other device that are damaged and/or too thin, which may lead to increased heat and subsequent failure of the connection when a current is passed through the electrical connection.

The present technology overcomes these issues with conventional CMP systems by providing electrochemical planarization apparatuses that may be used to planarize the metallic features (e.g., copper, cobalt, molybdenum, tungsten, and/or ruthenium features) on a substrate while minimizing non-uniformity and preventing dishing or other erosion of metal materials within trenches or other recesses formed between areas of film. In particular, electrochemical processes may be provided that enable only metallic material in contact with a surface of a conductive end effector to be selectively removed, and may prevent any material below the surface of non-metallic film (e.g., within a trench or other recess) to be removed, as such material will not contact the surface of the end effector. These techniques may be used in conjunction with conventional CMP systems (which may planarize non-metallic features) to produce substrates with improved thickness uniformity. Additionally, embodiments may include chuck mechanisms that may help flatten a substrate during planarizing, which may further improve the uniformity achieved during the planarization operation. Embodiments may enable the end effector to translate laterally relative to the substrate, which may enable the electrochemical planarization apparatus to improve non-uniformity issues.

Although the remaining disclosure will routinely identify specific film measurement processes utilizing the disclosed technology, it will be readily understood that the systems and methods are equally applicable to a variety of other semiconductor processing operations and systems. Accordingly, the technology should not be considered to be so limited as for use with the described electrochemical planarization systems or processes alone. The disclosure will discuss one possible system that can be used with the present technology before describing systems and methods or operations of exemplary process sequences according to some embodiments of the present technology. It is to be understood that the technology is not limited to the equipment described, and processes discussed may be performed in any number of processing chambers and systems, along with any number of modifications, some of which will be noted below.

FIG. 1 shows a schematic cross-sectional view of an exemplary polishing system 100 according to some embodiments of the present technology. Polishing system 100 includes a platen assembly 102, which includes a lower platen 104 and an upper platen 106. Lower platen 104 may define an interior volume or cavity through which connections can be made, as well as in which may be included end-point detection equipment or other sensors or devices, such as eddy current sensors, optical sensors, or other components for monitoring polishing operations or components. For example, and as described further below, fluid couplings may be formed with lines extending through the lower platen 104, and which may access upper platen 106 through a backside of the upper platen. Platen assembly 102 may include a polishing pad 110 mounted on a first surface of the upper platen. A substrate carrier 108, or carrier head, may be disposed above the polishing pad 110 and may face the polishing pad 110. The platen assembly 102 may be rotatable about an axis A, while the substrate carrier 108 may be rotatable about an axis B. The substrate carrier may also be configured to sweep back and forth from an inner radius to an outer radius along the platen assembly, which may, in part, reduce uneven wear of the surface of the polishing pad 110. The polishing system 100 may also include a fluid delivery arm 118 positioned above the polishing pad 110, and which may be used to deliver polishing fluids, such as a polishing slurry, onto the polishing pad 110. Additionally, a pad conditioning assembly 120 may be disposed above the polishing pad 110, and may face the polishing pad 110.

In some embodiments of performing a chemical-mechanical polishing process, the rotating and/or sweeping substrate carrier 108 may exert a downforce against a substrate 112, which is shown in phantom and may be disposed within or coupled with the substrate carrier. The downward force applied may depress a material surface of the substrate 112 against the polishing pad 110 as the polishing pad 110 rotates about a central axis of the platen assembly. The interaction of the substrate 112 against the polishing pad 110 may occur in the presence of one or more polishing fluids delivered by the fluid delivery arm 118. A typical polishing fluid may include a slurry formed of an aqueous solution in which abrasive particles may be suspended. Often, the polishing fluid contains a pH adjuster and other chemically active components, such as an oxidizing agent, which may enable chemical mechanical polishing of the material surface of the substrate 112.

The pad conditioning assembly 120 may be operated to apply a fixed abrasive conditioning disk 122 against the surface of the polishing pad 110, which may be rotated as previously noted. The conditioning disk may be operated against the pad prior to, subsequent, or during polishing of the substrate 112. Conditioning the polishing pad 110 with the conditioning disk 122 may maintain the polishing pad 110 in a desired condition by abrading, rejuvenating, and removing polish byproducts and other debris from the polishing surface of the polishing pad 110. Upper platen 106 may be disposed on a mounting surface of the lower platen 104, and may be coupled with the lower platen 104 using a plurality of fasteners 138, such as extending through an annular flange shaped portion of the lower platen 104.

The polishing platen assembly 102, and thus the upper platen 106, may be suitably sized for any desired polishing system, and may be sized for a substrate of any diameter, including 200 mm, 300 mm, 450 mm, or greater. For example, a polishing platen assembly configured to polish 300 mm diameter substrates, may be characterized by a diameter of more than about 300 mm, such as between about 500 mm and about 1000 mm, or more than about 500 mm. The platen may be adjusted in diameter to accommodate substrates characterized by a larger or smaller diameter, or for a polishing platen 106 sized for concurrent polishing of multiple substrates. The upper platen 106 may be characterized by a thickness of between about 20 mm and about 150 mm, and may be characterized by a thickness of less than or about 100 mm, such as less than or about 80 mm, less than or about 60 mm, less than or about 40 mm, or less. In some embodiments, a ratio of a diameter to a thickness of the polishing platen 106 may be greater than or about 3:1, greater than or about 5:1, greater than or about 10:1, greater than or about 15:1, greater than or about 20:1, greater than or about 25:1, greater than or about 30:1, greater than or about 40:1, greater than or about 50:1, or more.

The upper platen and/or the lower platen may be formed of a suitably rigid, light-weight, and polishing fluid corrosion-resistant material, such as aluminum, an aluminum alloy, or stainless steel, although any number of materials may be used. Polishing pad 110 may be formed of any number of materials, including polymeric materials, such as polyurethane, a polycarbonate, fluoropolymers, polytetrafluoroethylene polyphenylene sulfide, or combinations of any of these or other materials. Additional materials may be or include open or closed cell foamed polymers, elastomers, felt, impregnated felt, plastics, or any other materials that may be compatible with the processing chemistries. It is to be understood that polishing system 100 is included to provide suitable reference to components discussed below, which may be incorporated in system 100, although the description of polishing system 100 is not intended to limit the present technology in any way, as embodiments of the present technology may be incorporated in any number of polishing systems that may benefit from the components and/or capabilities as described further below.

Figure 2:
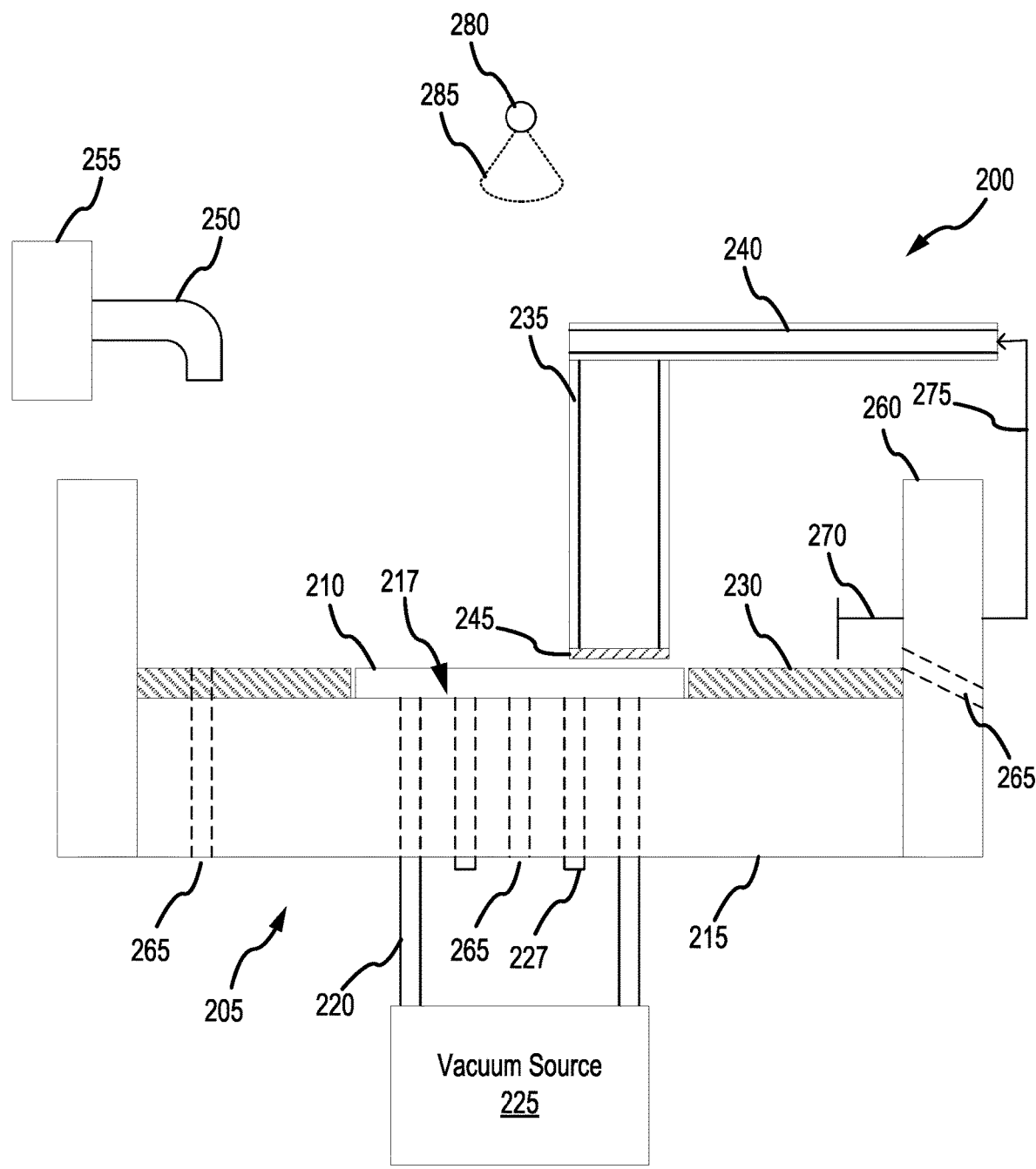
FIG. 2 shows a schematic partial cross-sectional view of an exemplary electrochemical planarization apparatus according to some embodiments of the present technology.

FIG. 2 illustrates a schematic cross-sectional view of an exemplary electrochemical planarization apparatus 200 according to some embodiments of the present technology. The apparatus 200 may be used to perform planarization operations. Apparatus 200 may show a partial view of the components being discussed and that may be incorporated in a semiconductor processing system. Apparatus 200 may include a substrate support 205. Substrate support 205 may receive and support a substrate 210 during one or more processing operations. In some embodiments, the substrate support 205 may include a chuck body 215, which may define a substrate support surface 217. Chuck body 215 may include associated channels or components to operate as a vacuum chuck, an electrostatic chuck, and/or any other type of chucking system. For example, chuck body 215 may define a number of channels 220 that are coupled with a vacuum source 225. The vacuum source 225 may create a negative pressure within the channels 220 that clamp the substrate 210 to the chuck body.

In other embodiments, the chuck body 215 may include an electrostatic chuck. In such embodiments, the chuck body 215 may include associated channels or components to operate as an electrostatic chuck. For example, the electrostatic chuck body 215 may be formed from a conductive material (such as a metal like aluminum or any other material that may be thermally and or electrically conductive) and may be coupled with a source of electric power (such as DC power, pulsed DC power, RF bias power, a pulsed RF source or bias power, or a combination of these or other power sources) through a filter, which may be an impedance matching circuit to enable the electrostatic chuck body 215 to operate as an electrode. In other embodiments, a top portion of the electrostatic chuck body 215 may be formed from a dielectric material. In such embodiments, the electrostatic chuck body 215 may include separate electrodes which may be embedded within the chuck body 215 proximate the substrate support surface. Each electrode may be electrically coupled with a DC power source that provides energy or voltage to the electrode. In operation, a substrate 210 may be in at least partial contact with the substrate support surface of the chuck body, which may produce a contact gap, and which may essentially produce a capacitive effect between a surface of the pedestal and the substrate. Voltage may be applied to the contact gap, which may generate an electrostatic force for chucking.

A plurality of lift pins 227 may extend through a plurality of holes formed in the chuck body 215. The lift pins 227 have first ends that are substantially flush with or slightly recessed from a top surface of the chuck body 215 when the lift pins 227 are in a normal position (i.e., retracted relative to the chuck body 215). The first ends may be flared or otherwise enlarged (not shown) to prevent the lift pins 227 from falling through the holes formed in the chuck body 215. Additionally, the lift pins 227 have a second end that extends beyond the lower side of the chuck body 215.

An edge ring 230 may be seated atop the chuck body 215. For example, the edge ring 230 may be positioned about the substrate support surface 217 such that the substrate 210 is disposed within an open interior of the edge ring 230. The edge ring 230 may help maintain the substrate 210 in a desired position as an end effector 245 is moved relative to a top surface of the substrate 210. An inner diameter of the edge ring 230 may be less than or about 5% greater than a diameter of the substrate 210, less than or about 4% greater than a diameter of the substrate 210, less than or about 3% greater than a diameter of the substrate 210, less than or about 2% greater than a diameter of the substrate 210, less than or about 1% greater than a diameter of the substrate 210, less than or about 0.5% greater than a diameter of the substrate 210, or less. For example, for a substrate 210 having a diameter of 300 mm, the edge ring 230 may have an inner diameter ranging from at least 300 mm to about 315 mm, although oftentimes the inner diameter may be between or about 300.5 mm and 305 mm. A thickness of the edge ring 230 may substantially match a thickness of the substrate 210. For example, the thickness of the edge ring 230 may be within or about 3% of a thickness of the substrate 210, within or about 2% of a thickness of the substrate 210, within or about 1% of a thickness of the substrate 210, within or about 0.5% of a thickness of the substrate 210, or less. For example, for a substrate 210 having a thickness of 1 mm, the thickness of the edge ring 230 may be between or about 0.970 mm and 1.030 mm, between or about 0.980 mm and 1.020 mm, between or about 0.990 mm and 1.010 mm, between or about 0.995 mm and 1.005 mm, or about 1 mm. In some embodiments, a top surface of the chuck body 215 on which the edge ring 230 is seated may be raised or lowered. In such embodiments, a thickness of the edge ring 230 may be adjusted such that a top surface of the edge ring 230 is within or about 3% of a height of a top surface of the substrate 210, within or about 2% of the height of the top surface, within or about 1% of the height of the top surface, within or about 0.5% of the height of the top surface, or less.

The edge ring 230 may be detachably coupled with the chuck body 215. For example, one or more clamps, fasteners, and/or other coupling mechanisms may be used to secure the edge ring 230 to a top surface of the chuck body 215. This may enable the edge ring 230 to be removed for repair, cleaning, and/or replacement.

Apparatus 200 may include a spindle 235 that may be positionable over the chuck body 215. While shown here as having a hollow cylindrical body, the spindle 235 may be formed from other shapes and/or may be solid in various embodiments. The spindle 235 may be rotatable and translatable vertically and/or laterally relative to the chuck body 215. For example, the spindle 235 may be coupled with an arm 240. While shown here as having a hollow cylindrical body, the arm 240 may be formed from other shapes and/or may be solid in various embodiments. The arm 240 may be translatable vertically and/or laterally relative to the chuck body 215. The spindle 235 and/or arm 240 may be coupled with one or more motors and/or other drive mechanism that may drive rotation and/or translation of the spindle 235. A bottom end of the spindle 235 may include end effector 245. The end effector 245 may be removably coupled with the bottom end of the spindle 235, which may enable the end effector 245 to be refinished, cleaned, and/or replaced as needed. For example, the end effector 245 may be coupled with the bottom end of the spindle 235 using an adhesive (such as a pressure sensitive adhesive), snap connector, hook and loop connector, and/or other coupling mechanism that may enable the end effector 245 to be removably coupled with the spindle 235. An electric current source 275 may apply a current to the electric contact 270, the chuck body 215, and/or the retaining wall 260 to the spindle 235, the arm 240, and/or the end effector 245. A circuit may be completed between the electric contact 270, electrolyte, metallic material on the substrate 210, and the end effector 245 that delivers the electric current to the metallic material to perform electrochemical planarization of the substrate 210.

End effector 245 may include a substantially planar exposed (e.g., lower) contact surface, which may be formed from and/or otherwise include a conductive material. For example, the exposed contact surface may be at least or about 95% planar, at least or about 97% planar, at least or about 99% planar, or greater. Such a design may ensure that the exposed surface may maintain uniform contact with a surface of the substrate 210 during planarization to ensure that metallic materials are planarized to a high degree of precision. End effector 245 may be a mesh material, such as a conductive mesh (such as a metal) that is covered in a polymeric material. In some embodiments, the end effector 245 may include and/or be formed from a conductive polymeric material. The conductive material may be electrically coupled with the current source 275 via one or more wires or other conductors, which may extend through, be coupled with, and/or form part of the spindle 235. The use of a polymeric material may reduce or eliminate scratching of the substrate film that would otherwise occur if a material, such as metal, was used.

The end effector 245 may have a circular, polygonal, annular, or any other shape that is sized such that the end effector 245 may planarize only certain regions of the substrate 210. For example, a diameter of the end effector 245 may be less than a diameter of the substrate 210 (and less than an inner diameter of the edge ring 230). For example, the diameter of the end effector 245 may be less than or about 90% of a diameter of the substrate 210, less than or about 80% of a diameter of the substrate 210, less than or about 70% of a diameter of the substrate 210, less than or about 60% of a diameter of the substrate 210, less than or about 50% of a diameter of the substrate 210, less than or about 40% of a diameter of the substrate 210, less than or about 30% of a diameter of the substrate 210, less than or about 20% of a diameter of the substrate 210, less than or about 15% of a diameter of the substrate 210, or less than or about 10% of a diameter of the substrate 210, less than or about 8% of a diameter of the substrate 210, or less than or about 6% of a diameter of the substrate 210, less than or about 4% of a diameter of the substrate 210, or less than or about 2% of a diameter of the substrate 210, or less. For example, for a 300 mm substrate 210, the diameter of the end effector 245 may be less than or about 270 mm, less than or about 240 mm, less than or about 210 mm, less than or about 180 mm, less than or about 150 mm, less than or about 120 mm, less than or about 90 mm, less than or about 60 mm, less than or about 45 mm, less than or about 30 mm, less than or about 24 mm, less than or about 18 mm, less than or about 12 mm, less than or about 6 mm, or less. However, it is also contemplated that the diameter of the end effector 245 may be greater than or about 100% of the diameter of the substrate 210. For example, for a 300 mm substrate 210, the outer diameter of the end effector 245 may be greater than or about 300 mm.

In embodiments, the apparatus 200 may include a plurality of end effectors 245. For example, apparatus 200 may include at least or about 1 end effector, at least or about 2 end effector, at least or about 3 end effector, at least or about 4 end effector, or more. Each of the plurality of end effectors 245 may be coupled with the bottom end of a spindle 235, and the spindle 235 may be couple with an arm 240, as previously discussed. With multiple end effectors 245, processing time may be decreased, which may increase overall throughput. With multiple end effectors 245, current density may be increased at specific locations, which may allow for more efficient removal of metallic material.

The apparatus 200 may include an electrolyte delivery port 250. The electrolyte delivery port 250 may be coupled with an electrolyte source 255 and may deliver an electrolyte from the electrolyte source 255 to a surface of the substrate 210 during planarizing operations. The electrolyte may include an aqueous solution containing ions that are electrically conducting through the movement of ions. For example, the electrolyte may be or include sulfuric acid, citric acid, ethylenediamine, hexadiamine, amino acids, ammonium oxalate, ammonium citrate, ammonium succinate, monobasic potassium citrate, dibasic potassium citrate, tribasic potassium citrate, tartaric acid, potassium tartarate, ammonium tartarate, succinic acid, potassium succinate, oxalic acid, potassium oxalate, Malic acid, Salicylic acid, benzotriazole, mercaptobenzotriazole, 5-methyl-1-benzotriazole, Hydroxybenzotriazol, potassium hydroxide, ammonium hydroxide, and combinations thereof, or any other suitable electrolytic material. The electrolyte may include between about 1 wt. % to about 0.01 wt. % silica, alumina, or zirconia abrasive particles. The silica, alumina, or zirconia abrasive particles may be characterized by a D50 of about 50 nm. In embodiments, the electrolyte may include various additives, such as a chelating agent, a lubricant, an oxidizer, a corrosion inhibitor, a pH adjusting agent, and/or a catalytic agent. The chelating agent may help bind removed metal material to prevent it from re-depositing. The lubricant may prevent scratching of metallic material that is not removed from the substrate 210. To help keep the electrolyte from spreading out away from the substrate 210, apparatus 200 may include a retaining wall 260. Retaining wall 260 may be an annular body extending from the chuck body 215. Retaining wall 260 may be positioned radially outward of both the edge ring 230 and the electrolyte delivery port 250 such that any electrolyte delivered to the substrate 210 via the electrolyte delivery port 250 is kept proximate the substrate 210. While shown with electrolyte delivery port 250 being positioned above the retaining wall 260, in some embodiments the electrolyte delivery port 250 may extend through a portion of the retaining wall 260 and/or chuck body 215. To help minimize the amount of electrolyte needed for a given planarizing operation, an inner surface of the retaining wall 260 may be positioned proximate to and may contact an outer surface of the edge ring 230 (although there may be a gap between the edge ring 230 and the retaining wall 260 in some embodiments). The retaining wall 260 may be formed integrally with chuck body 215 and/or may be a separate component that is later coupled with the chuck body 215. The retaining wall 260 may be coupled with an outer surface of the chuck body 215 as illustrated here and/or may be seated atop the chuck body 215 (similar to edge ring 230) in other embodiments. That is, the retaining wall 260 may extend from the chuck body 215. Apparatus 200 may include an electrolyte drainage port 265 that may be used to passively drain and/or actively pump electrolyte out of the area within the retaining wall 260 before, during, and/or after a given planarizing operation. For example, the electrolyte drainage port 265 may extend through the retaining wall 260 and/or chuck body 215. In some embodiments, the electrolyte drainage port 265 may also extend through the edge ring 230. In such embodiments, the edge ring 230 may include one or more alignment features (such as pins) that ensure that the edge ring 230 is properly oriented on the chuck body 215 to align the portion of the electrolyte drainage port 265 on the edge ring 230 with the portion of the electrolyte drainage port 265 on the chuck body 215 and/or retaining wall 260. While shown with only a single electrolyte drainage port 265, it will be appreciated that multiple electrolyte drainage ports may be used in various embodiments. For example, one or more electrolyte drainage ports 265 may be positioned radially outward of the substrate support surface 217 (such as outward of, through, and/or below the edge ring 230) and/or one or more electrolyte drainage ports 265 may extend through the substrate support surface 217. Such a configuration may better enable electrolyte to be removed from all areas of the chuck body 215. Where multiple electrolyte drainage ports 265 are positioned within a given area of the chuck body 215, the electrolyte drainage ports may be positioned at regular and/or irregular intervals about the chuck body 215.

In embodiments, an electrolyte may be delivered to the substrate 210. The electrolyte may contain ions that are electrically conducting through the movement of ions. When an electric current is applied, cations of the electrolyte are drawn to the electrode that has an abundance of electrons, while anions of the electrolyte are drawn to the electrode that has a deficit of electrons. The movement of anions and cations in opposite directions within the solution amounts to a current. The electrolyte may be free of any abrasive particles that may provide grit that results in the end effector 245 mechanically removing the film on the substrate. Electrolyte may be delivered to the substrate 210 continuously and/or periodically via the electrolyte delivery port 250 and may be removed via the electrolyte drainage port 265. In operation, a suitable amount to contact the upper surface of the substrate 210 may be provided to the apparatus 200. For example, greater than or about 500 cubic centimeter (cc) of electrolyte may be provided. In some embodiments, lesser amounts of electrolyte may be provided, such as less than or about 500 cc, less than or about 450 cc, less than or about 400 cc, less than or about 350 cc, less than or about 300 cc, less than or about 250 cc, less than or about 200 cc, less than or about 150 cc, less than or about 100 cc, less than or about 50 cc, or less.

Apparatus 200 may include an electric contact 270. The electric contact 270 may extend from the chuck body 215 and/or retaining wall 260. In operation, the electric contact 270 may provide an electric current to an electrolyte within an open interior defined by the retaining wall 260. An electric current 275 applied to the electrolyte may facilitate the removal of material during planarization operations when the conductive end effector 245 contacts a metallic feature of the substrate 210. The electric current 275 may be applied from the electric contact 270, the chuck body 215, and/or the retaining wall 260 to the spindle 235, the arm 240, and/or the end effector 245. The electric current 275 may complete the circuit necessary to perform electrochemical planarization of the substrate 210. While shown with only a single electric contact 270, it will be appreciated that multiple electric contacts may be used in various embodiments. For example, one or more electric contacts 270 may be positioned around the retaining wall 260. Such a configuration may better enable an electric current to be applied to the electrolyte. Where multiple electric contacts 270 are positioned around the retaining wall 260, the electric contacts 270 may be positioned at regular and/or irregular intervals about the retaining wall 260.

To monitor removal of material, the apparatus may include an optical sensor 280. The optical sensor 280 may be, for example, a camera, a depth sensor, an optical interferometer, an Eddy current sensor, an image sensor that is machine learning capable (e.g., to detect metallic material residues), or any other apparatus to monitor removal of material. The optical interferometer may detect the topography of the metallic material. The Eddy current sensor may monitor overburden metallic material thickness (e.g., metallic material extending above and/or out of the feature). The optical sensor 280 may be positioned above the substrate 210. In operation, a field of view 285 may extend from the optical sensor 280 toward the substrate 210. The optical sensor may monitor the removal of a desired material. Additional equipment, such as processors and/or controllers, may relay information about the removal of material from the substrate 210. The additional equipment may instruct the spindle 235 to move to and contact areas of the substrate 210 where material is to be removed. For example, where one or more sensors determine that there is copper (or other metallic material) outside of a trench to be removed, the optical sensor 280 may direct the end effector 245 to the detected location until no metallic material remains above the trench or feature in the substrate 210. In some embodiments, a relative depth or other quantity of metallic for removal may be detected. Based on this measurement, an amount of time the end effector 245 may be set to ensure that all of the excess metallic material is removed. While shown with only a single optical sensor 280, it will be appreciated that multiple optical sensors may be used in various embodiments. For example, one or more optical sensors 280 may be positioned above the substrate 210 at different positions. Such a configuration may better enable removal of material from the substrate 210, as different viewing/sensing angles may be provided that help avoid issues when the spindle 235 and/or end effector 245 are disposed between a given optical sensor 280 and the substrate 210. Where multiple optical sensors 280 are positioned above the substrate 210, the optical sensors 280 may be positioned at regular and/or irregular intervals above the substrate 210.

In operation, substrate 210 may be positioned face up within the open interior of the edge ring 230 atop the substrate support surface 217. By positioning the substrate 210 face up atop the substrate support surface 217, with an electrolyte atop the substrate 210, hydrogen bubbles being trapped on the substrate 210 surface may be reduced or eliminated. Further, possible arching and/or bowing of the substrate 210 may be reduced during operation. The face up configuration may also reduce or prevent residue on the surface of the substrate 210 during operation, such as residue buildup of the removed metallic material. A chucking force, such as a vacuum force and/or electrostatic chucking force, may be applied to the substrate 210 to clamp the substrate 210 to the substrate support surface 217. In some instances, in addition to clamping the substrate 210 to the substrate support surface 217, the chucking force may reduce and/or eliminate any bowing of the substrate 210 such that the substrate 210 is substantially flat prior to initiating any planarizing operation. The spindle 235 and end effector 245 may be positioned over the substrate 210. The end effector 245 may be positioned against the surface of the substrate 210 and may be rotated to planarize film on the substrate 210. Oftentimes, the spindle 235 and end effector 245 are rotated at a rate of between or about 60 rpm and 200 rpm, between or about 80 rpm and 180 rpm, between or about 100 rpm and 160 rpm, or between or about 120 rpm and 140 rpm, although other rates are possible in various embodiments. Downward force of the end effector 245 may be adjusted by the drive mechanism based on the needs of a particular planarizing operation. To prevent dishing or non-uniform removal of material, downward force may be negligible. For example, the force may be adjusted between about 0.1 psi and about 2.0 psi, and may be less than or about 1.5 psi, less than or about 1.0 psi, less than or about 0.8 psi, less than or about 0.6 psi, less than or about 0.4 psi, less than or about 0.2 psi, or less, although other levels of force may be utilized in various embodiments. The end effector 245 may be coaxially aligned with the substrate 210, which may be used to produce a symmetric planarization of the substrate 210. In other embodiments, the end effector 245 may be offset from the central axis of the substrate 210, which may enable asymmetric planarization to be performed. In some embodiments, the end effector 245 (and spindle 235) may be laterally translated (or swept) during rotation of the end effector 245 to control the eccentricity of the end effector 245 to alter the planarizing pattern of apparatus 200. Oftentimes, the lateral distance covered during sweeping may be less than or about 10 mm, less than or about 9 mm, less than or about 8 mm, less than or about 7 mm, less than or about 6 mm, less than or about 5 mm, less than or about 4 mm, less than or about 3 mm, less than or about 2 mm, less than or about 1 mm, or less. A rate of the sweeping motion may be adjusted based on the starting and/or desired film thickness profile.

Such operation of the apparatus 200 may enable uniform or nearly uniform removal of exposed material on the surface of the substrate 210. Additionally, by using a laterally translatable spindle 235, the apparatus 200 may be swept and/or otherwise translated to account for asymmetric non-uniformity issues. Planarizing as described herein may be used in conjunction with conventional CMP polishing operations to uniformly polish an entire film surface of a substrate. For example, the planarizing may be performed before and/or after conventional face-down CMP polishing.

While discussed primarily for improving film uniformity across a substrate, it will be appreciated that the techniques described herein may also be used to generate other film thickness profiles in some embodiments by providing the ability to tailor planarizing operations without affecting the planarizing of the rest of a substrate.

Figure 3:
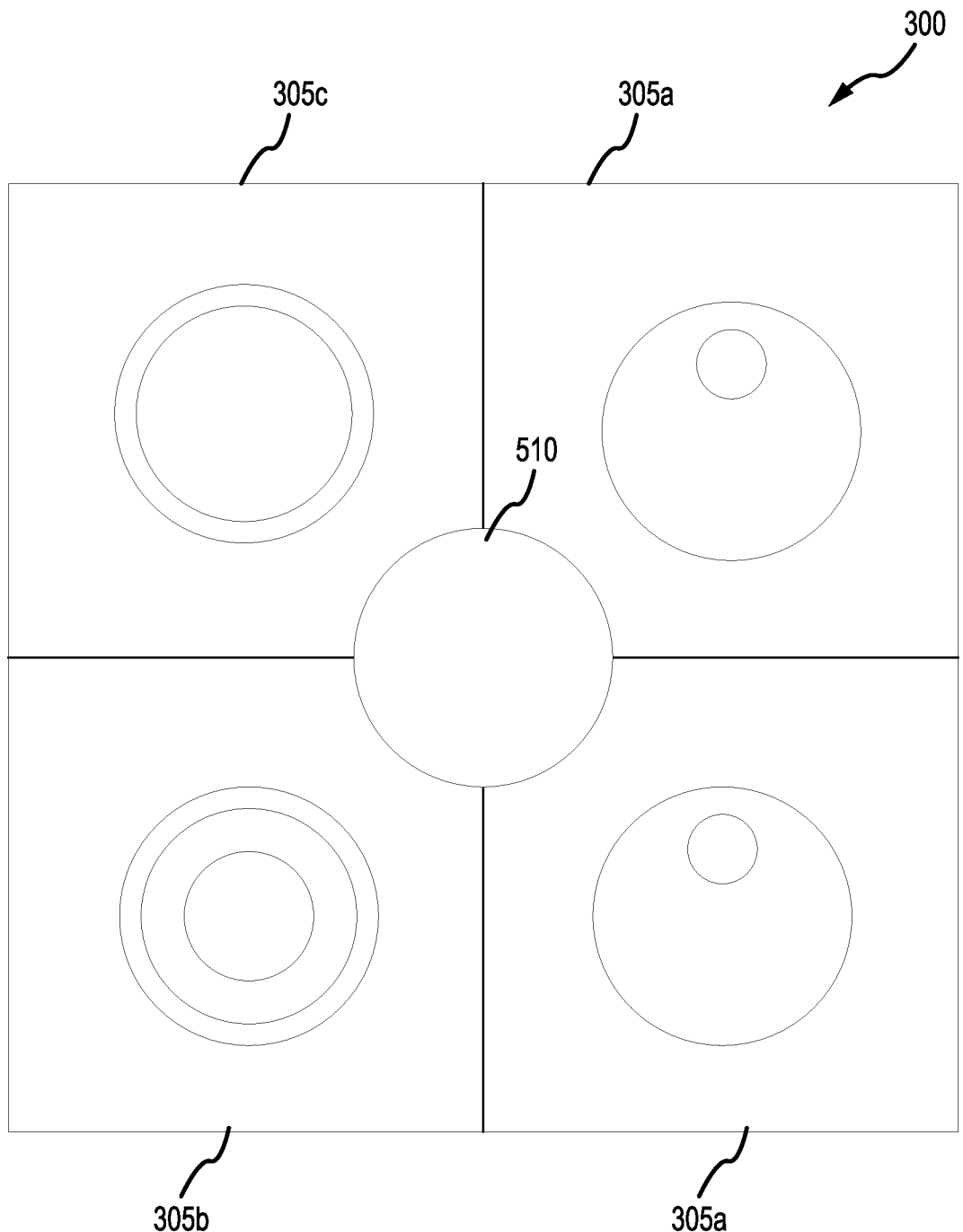
FIG. 3 shows a schematic partial top plan view of an exemplary polishing chamber according to some embodiments of the present technology.

FIG. 3 illustrates a schematic top plan view of a polishing chamber 300 according to some embodiments of the present technology. Chamber 300 may include any number of stations 305, which may be used to perform one or more polishing operations. For example, chamber 300 may include at least or about 1 station, at least or about 2 stations, at least or about 3 stations, at least or about 4 stations, or more. Each station 305 may include one or more polishing systems. For example, the stations 305 may include one or more conventional CMP systems 305*a* (such as system 100) and/or one or more electrochemical planarization apparatus 305*b* (such as apparatus 200), face-up edge planarization apparatus, in additional to other refinishing stations 305*c*. The various stations may be provided in any number, arrangement, and/or combination. As just one example, the chamber 300 may include two CMP stations 305*a*, one electrochemical planarization apparatus 305*b*, and one refinishing station 305*c*. Chamber 300 may include one or more robots 310 that may be used to move substrates from one station 305 to another. For example, the robot 310 may transfer a substrate between one of the CMP stations 305*a* and the electrochemical planarization apparatus 305*b*.

Figure 4:
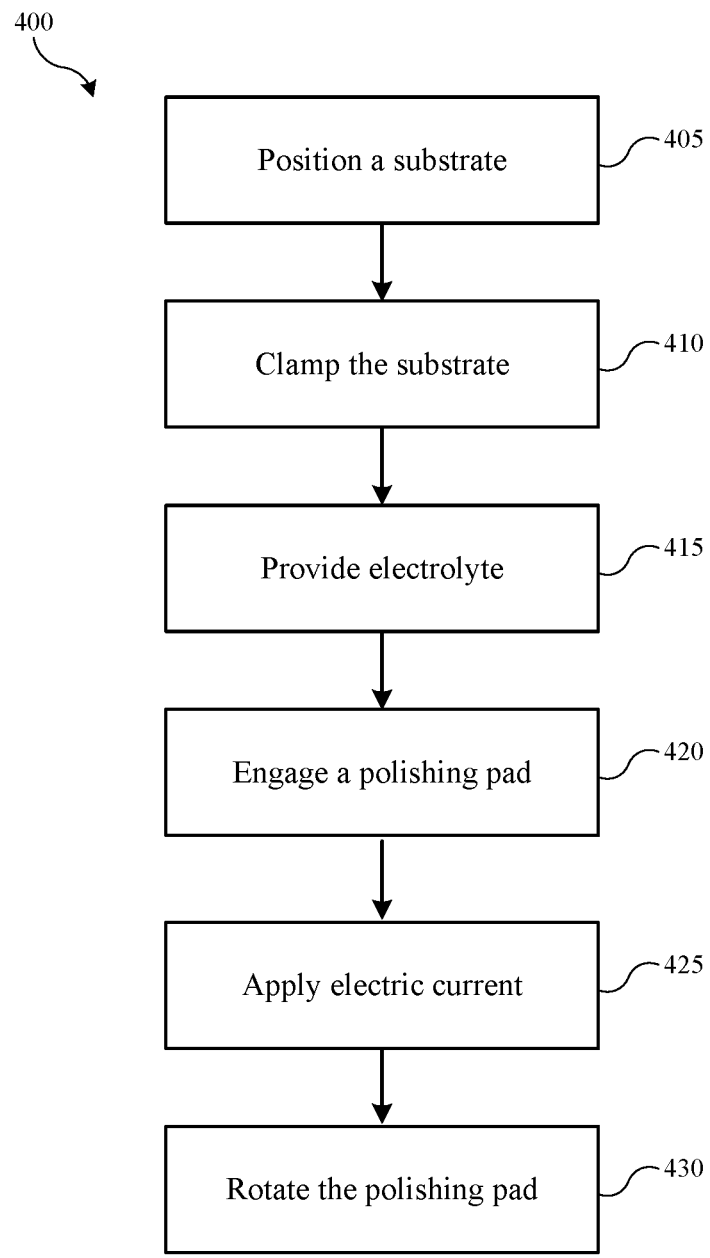
FIG. 4 is a flowchart of an exemplary method of planarizing a substrate according to some embodiments of the present technology.

FIG. 4 shows exemplary operations in a method 400 for planarizing a substrate according to some embodiments of the present technology. Method 400 may be performed using an electrochemical planarization apparatus, such as electrochemical planarization apparatus 200 described herein. Method 400 may include operations prior to the substrate planarization in some embodiments. For example, prior to the planarization, a substrate may have one or more deposition and/or etching operations performed as well as any planarization or other process operations performed. Method 400 may include a number of operations that may be performed automatically within a system to limit manual interaction, and to provide increased efficiency and precision over manual operations. Method 400 may be performed in conjunction with a conventional CMP polishing process. For example, the conventional CMP polishing process may be performed before and/or after method 400.

Method 400 may include positioning a substrate face up within atop a substrate support surface of a chuck body within an open interior defined by a retaining wall extending from the chuck body at operation 405. The substrate may be clamped to the chuck body at operation 410. For example, a chucking mechanism may be activated to provide a vacuum chucking force and/or an electrostatic chucking force that may clamp and/or flatten the substrate against the substrate support surface. An electrolyte may be provided to the open interior defined by the chuck body and the retaining wall at operation 415. In embodiments, the electrolyte may be provided to a top surface of the substrate, and in some embodiments may cover the entire top surface. The electrolyte may be any solution or medium containing ions that are electrically conducting. The electrolyte may facilitate electrochemical operations to remove material. A top surface of the substrate may be engaged with an annular end effector at operation 420. This contact may form a closed circuit that allows for the electrochemical removal of material during the planarizing operation. An electric current may be applied to the electrolyte at operation 425. The electric current, in conjunction with a suitable electrolyte, may drive an electrochemical reaction on the surface of the substrate exposed to the electrolyte. In operation, when the electric current is applied to the electrolyte a conductive film may be removed from the surface of the substrate. Furthermore, in operation, the electric current may be varied. Depending on the location of the end effector with respect to location on the substrate, the electric current may be increased or decreased, as well as maintained. For example, a thickness of the metallic profile may be asymmetric and a portion of the substrate may have a thicker metallic profile depending deposition methods. Accordingly, the electric current may be varied in order to compensate for a thickness of the metallic profile in various regions on the substrate.

At operation 430, the end effector may be rotated against the top surface of the substrate to planarize the substrate. For example, a central axis of the end effector may be coaxial with a central axis of the substrate while rotating the end effector against the top surface of the substrate to uniformly planarize the substrate. The central axis of the end effector may be offset from a central axis of the substrate while rotating the end effector against the top surface of the substrate to planarize away asymmetric film thickness non-uniformity issues. In some embodiments, the end effector may be laterally translated, or swept, about the surface of the substrate while rotating the end effector against the top surface of the substrate to planarize the substrate in a desired pattern and/or to achieve a desired film thickness profile. In operation, the end effector may sweep across substrate. Depending on the material to be removed, and the thickness of the material, the residence time of the end effector at some locations may be shorter or longer than the residence time of the end effector at other locations. The sweeping movement of the end effector across the substrate may control the metallic material removal profile radially. In embodiments, the chuck body may also rotate. The metallic material removal profile may be adjusted radially and angularly through combination of end effector sweep and chuck body rotation. Negligible, such as less than or about 2.0 psi, or zero downward force may be applied to the end effector while rotating the end effector against the top surface of the substrate. The magnitude of the downward force, which may be negligible to ensure a more electrochemical removal rather than a mechanical removal, may be adjusted to control a rate of planarization of the electrochemical planarization apparatus. The planarization, with the application of an electric current in the presence of an electrolyte, may serve to be the opposite of electroplating (i.e., removal of material versus application of material).

The electrolyte may be delivered to the substrate continuously and/or periodically via an electrolyte delivery port. Once a given planarizing operation has been completed, the electrolyte may be removed from the apparatus, such as by draining and/or pumping the electrolyte via an electrolyte drainage port.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A substrate electrochemical planarization apparatus, comprising:
 a chuck body defining a substrate support surface for supporting a substrate;

a retaining wall extending from the chuck body;
an electrolyte delivery port disposed radially inward of the retaining wall;
a spindle that is positionable over the chuck body;
an end effector coupled with a lower end of the spindle, wherein the end effector is conductive;
an electric contact extending from the chuck body or retaining wall, wherein the electric contact is disposed radially outward of the substrate; and
a current source, wherein the current source is configured to provide an electric current to an electrolyte within an open interior defined by the retaining wall.

2. The substrate electrochemical planarization apparatus of claim 1, wherein:
the end effector is characterized by a diameter of less than or about 150 mm.

3. The substrate electrochemical planarization apparatus of claim 1, wherein:
the spindle is rotatable and laterally translatable relative to the chuck body.

4. The substrate electrochemical planarization apparatus of claim 1, wherein:
a surface of the end effector facing the substrate support surface is planar.

5. The substrate electrochemical planarization apparatus of claim 1, wherein:
the retaining wall is annular; and
a diameter of end effector is less than an inner diameter of the retaining wall.

6. The substrate electrochemical planarization apparatus of claim 1, further comprising:
an electrolyte drainage port positioned within one or both of the chuck body and the retaining wall.

7. The substrate electrochemical planarization apparatus of claim 1, further comprising:
an edge ring seated on the chuck body.

8. A substrate electrochemical planarization apparatus, comprising:
a chuck body defining a substrate support surface for supporting a substrate;
a retaining wall extending from the chuck body;
a spindle that is positionable over the chuck body;
a rotation drive mechanism coupled with the spindle;
an end effector coupled with a lower end of the spindle;
an electric contact extending from the chuck body or the retaining wall, wherein the electric contact is vertically spaced apart from the substrate; and
a current source, wherein the current source is configured to provide an electric current to an electrolyte within an open interior defined by the retaining wall.

9. The substrate electrochemical planarization apparatus of claim 8, wherein:
the end effector comprises a conductive material.

10. The substrate electrochemical planarization apparatus of claim 8, further comprising:
an edge ring seated on the chuck body, wherein an inner diameter of the edge ring is less than about 5% larger than a diameter of substrate support surface.

11. The substrate electrochemical planarization apparatus of claim 8, wherein:
the retaining wall is disposed radially outward of the chuck body, the retaining wall being annular; and
a diameter of end effector is less than an inner diameter of the retaining wall.

12. The substrate electrochemical planarization apparatus of claim 8, wherein the retaining wall is disposed radially outward of the chuck body, the substrate electrochemical planarization apparatus further comprising:
an electrolyte source; and
an electrolyte delivery port fluidly coupled with the electrolyte source, the electrolyte delivery port being disposed radially inward of the retaining wall.

13. The substrate electrochemical planarization apparatus of claim 8, further comprising:
an optical sensor, the optical sensor being directed at the substrate support surface.

14. The substrate electrochemical planarization apparatus of claim 8, wherein:
the substrate electrochemical planarization apparatus is disposed within a polishing chamber that comprises a face down polishing station.

* * * * *